United States Patent [19]
Hoult et al.

[11] 4,193,024
[45] Mar. 11, 1980

[54] PULSED NUCLEAR MAGNETIC RESONANCE SPECTROMETERS

[75] Inventors: David I. Hoult, Silver Spring, Md.; Peter Styles, Oxford, England

[73] Assignee: National Research Development Corporation, London, England

[21] Appl. No.: 924,437

[22] Filed: Jul. 13, 1978

[30] Foreign Application Priority Data

Feb. 15, 1978 [GB] United Kingdom ............... 06007/78

[51] Int. Cl.² ........................................... G01R 33/08
[52] U.S. Cl. ................................................ 324/313
[58] Field of Search .......... 324/0.5 R, 0.5 A, 0.5 AC, 324/0.5 H

[56] References Cited

U.S. PATENT DOCUMENTS

| | | | |
|---|---|---|---|
| 3,609,519 | 9/1971 | Seki | 324/0.5 R |
| 3,774,103 | 11/1973 | Laukien | 324/0.5 R |
| 4,110,681 | 8/1978 | Hofer | 324/0.5 A |

Primary Examiner—M. Tokar
Attorney, Agent, or Firm—Cushman, Darby & Cushman

[57] ABSTRACT

A pulsed N.M.R. spectrometer employing a highly stable magnet (e.g. a superconducting magnet) has a field-frequency lock which is operative to correct the intensity of the magnetic field only at discrete intervals. The lock operates on the principles of a phase locked loop, and utilizes the free induction decay of the magnetic resonance of an appropriate nuclear species incorporated in a reference sample which is subjected to the magnetic field.

1 Claim, 1 Drawing Figure

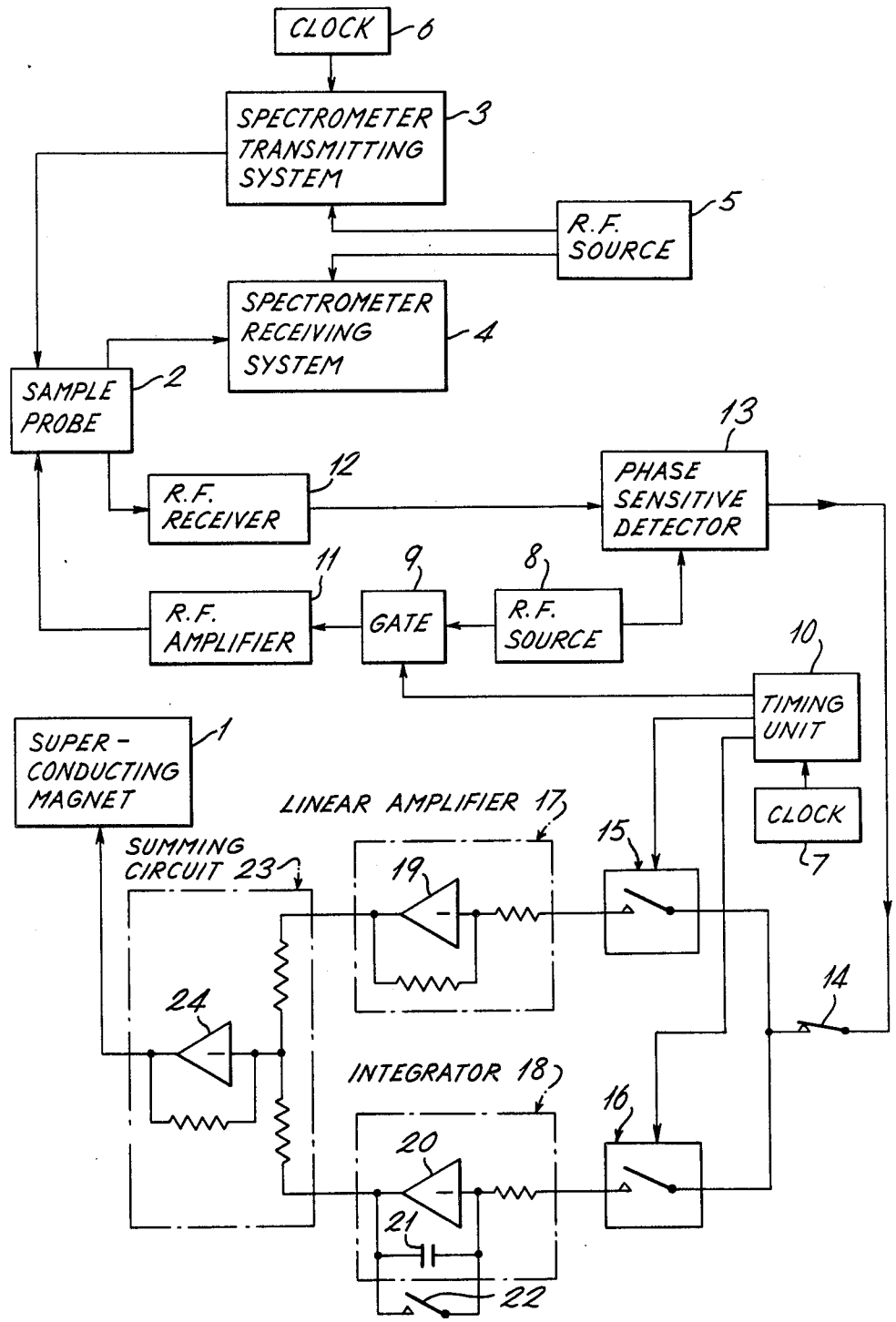

PULSED NUCLEAR MAGNETIC RESONANCE SPECTROMETERS

In a pulsed nuclear magnetic resonance spectrometer, magnetic resonance of the nuclear species of interest is excited in a sample under investigation by irradiating the sample with pulses of a radio frequency oscillation while subjecting it to an intense magnetic field, the desired magnetic resonance spectrum being obtained by analysis of the resulting transient signals emanating from the sample. Where the spectrometer is designed for high resolution work, it is normal to provide a system (commonly referred to as a field-frequency lock) for automatically stabilising the relationship between the intensity of the magnetic field and the frequency of the r.f. oscillation. The arrangement conventionally employed for this purpose entails detection of the magnetic resonance of a nuclear species other than that for which a spectrum is to be obtained, this second nuclear species being contained in a reference sample which is subjected to the magnetic field concurrently with the sample under investigation; the reference sample may be intermixed with the sample under investigation or may be physically separate therefrom, and for example when the spectrometer is designed for investigation of proton resonance the reference sample may consist of heavy water with the second nuclear species being deuterons.

With this conventional arrangement it is usual for the stabilisation system to operate by controlling the intensity of the magnetic field by means of a d.c. error signal which is effectively constituted by the direct and integrated output of an auxiliary nuclear magnetic resonance spectrometer responsive to the second nuclear species, this auxiliary spectrometer being a continuous wave spectrometer operating in the dispersion mode with a fixed excitation frequency. Certain disadvantages are, however, encountered with this type of system. Firstly, interactions may occur between the auxiliary spectrometer and the main spectrometer, giving rise to spurious responses in the output of the latter. Secondly, the setting of the magnetic field intensity is dependent upon the phase of the received signal in the auxiliary spectrometer, and this phase may vary significantly in certain circumstances, especially due to changes in the temperature of the sample probe.

The present invention provides a means whereby these disadvantages may be alleviated in cases where the magnetic field utilised in a pulsed nuclear magnetic resonance spectrometer is generated by a highly stable magnet, for example a superconducting magnet. In such cases any stabilisation system is required to counter only relatively long term variations of the magnetic field (of the order of seconds or upwards), and in arrangements according to the invention advantage is taken of this fact by providing a stabilisation system which is operative to correct the intensity of the magnetic field only at discrete intervals; the system is designed to operate in accordance with the principles of a phase locked loop, and utilises, for the purpose of monitoring the intensity of the magnetic field, the free induction decay of the magnetic resonance of an appropriate nuclear species incorporated in a reference sample.

Thus, according to the invention there is provided a stabilisation system for a magnet employed in a pulsed nuclear magnetic resonance spectrometer, the system comprising means for exciting magnetic resonance of a given nuclear species in a reference sample subjected to the magnetic field generated by the magnet, by irradiating said sample with pulses of radio frequency energy spaced apart by intervals substantially greater than the time constant for free induction decay of said magnetic resonance, means for receiving resonance signals emanating from said sample during said intervals, a detection system for effecting phase-sensitive detection of the received signals with reference to said radio frequency energy, and means for adjusting the intensity of said magnetic field by the application to the magnet of first and second control signals derived from the output of the detection system, the first control signal being proportional to the output of the detection system and being derived only during periods which immediately follow said pulses and have a duration approximately equal to said time constant, and the second control signal being proportional to the output of an integrator to which the output of the detection system is applied only during a portion of each of said periods, the start of said portion being later than the start of the relevant period by a time sufficient for the initial adjustment during that period of the intensity of the magnetic field by virtue of the application of the first control signal to have brought about effective locking of the frequency of said resonance signals to the frequency of said radio frequency energy.

One arrangement in accordance with the invention will now be described by way of example with reference to the accompanying drawing, which is a diagrammatic representation of a pulsed nuclear magnetic resonance spectrometer suitable for obtaining proton resonance spectra.

The magnetic field required in the spectrometer is generated by a superconducting magnet 1, having the usual shift coils (not separately indicated in the drawing) to which control signals can be applied so as to adjust the intensity of the field. The magnetic field will typically have a flux density in the range of about 2–12 T, and for high resolution work should have a homogeneity of the order of one part in $10^9$. In use of the spectrometer, a sample for which a spectrum is to be obtained is located within a conventional sample probe 2 disposed in the magnetic field and having the usual transmitting and receiving coils (not separately indicated in the drawing); also located within the probe 2 is a reference sample consisting of heavy water. The spectrometer further includes conventional transmitting and receiving systems 3 and 4 respectively coupled to the transmitting and receiving coils of the probe 2, and respectively performing the functions of irradiating the sample under investigation with pulses of radio frequency energy to excite proton magnetic resonance and detecting the resultant transient signals emanating from the sample; the r.f. oscillations utilised in the systems 3 and 4 are generated by a source 5 whose nominal frequency is chosen so that its numerical value bears an appropriate ratio to that of the intended intensity of the magnetic field. The actual ratio of the numerical values of the frequency of the source 5 and the magnetic field intensity is of course liable to depart from the ideal value because of departures of these quantities from absolute constancy; in practice changes in the magnetic field intensity are likely to be much the more significant in this respect. Analysis of the detected signals to obtain the desired spectrum is effected in a separate data processing apparatus (not shown) utilising Fourier transform techniques. For many experiments, such analysis will require the accumulation of data in respect of a series of irradiating pulses (or pulse sequences); in such cases the individual pulses or pulse sequences will normally be separated by intervals having a duration of the order of one to ten seconds, the data being collected during the initial parts of these intervals while free induction decay of the proton magnetic resonance is occurring. Accordingly, a clock 6 is provided for controlling the timing of the generation of the irradiating pulses or pulse sequences in the transmitting system 3.

The remaining components shown in the drawing constitute parts of a stabilisation system for the magnet 1, which is operative to maintain substantially constant the ratio of the numerical values of the frequency of the source 5 and the magnetic field intensity. In this system corrective adjustments of the magnetic field are effected, under the control of a clock 7, only during discrete periods (subsequently referred to as correcting periods) separated by intervals having a duration of the order of one second; during these intervals the inherent stability of the magnet 1 ensures that only slight changes will occur in the intensity of the magnetic field. During the performance of an experiment the operation of the clock 7 is arranged to be synchronized with that of the clock 6 so that a correcting period occurs immediately before the start of each irradiating pulse or pulse sequence; where the intervals between successive irradiating pulses or pulse sequences are relatively long one or more additional correcting periods may be arranged to occur during each such interval at times when data collection is not occurring. As will be more readily appreciated from the subsequent description of the stabilisation system, the non-overlapping temporal relationship between the correcting periods and the periods during which data collection occurs greatly reduces the risk of spurious responses arising in the output of the system 4 due to interaction between the stabilisation system and the systems 3 and 4. The clock 7 is also operable independently of the clock 6, so that the stabilisation system can be brought into operation some time before the start of an experiment, as is obviously desirable.

The system includes a radio frequency source 8 having a nominal frequency equal to the value of the deuteron Larmor frequency at the intended magnetic field intensity. The sources 5 and 8 are so inter-related as to maintain highly stable the ratio of their respective frequencies; for example the sources 5 and 8 may be frequency synthesisers driven by a common crystal controlled oscillator. An output from the source 8 is applied to a gate 9, which is periodically opened under the control of signals derived from a timing unit 10 controlled by the clock 7. The output of the gate 9 thus consists of a train of r.f. pulses repeated at the required repetition rate for the correcting periods; the pulse train is applied to a r.f. amplifier 11, the output of which is fed to the transmitting coils of the probe 2 so as to excite magnetic resonance of the deuterons in the reference sample, the arrangement being made such that free induction decay of this magnetic resonance occurs after each pulse. The receiving coils of the probe 2 are connected to the input of a r.f. receiver 12 for receiving the resultant r.f. signals emanating from the reference sample. These signals of course decay exponentially after the end of each pulse, with a time constant (denoted in the art by $T_2^*$) which typically has value lying in the range 50–200 milliseconds. During the decay period, the frequency of the received signals will of course vary in accordance with any variation in the magnetic field intensity, since that frequency is equal to the deuteron Larmor frequency.

The output of the receiver 12 and an output from the source 8 are applied to a phase-sensitive detector 13; the output of the detector 13, which is proportional to the cosine of the phase angle between the two signals applied to the detector 13, is utilised as an error signal in the correction of the intensity of the magnetic field. The error signal is applied to one terminal of a manually operable switch 14, which is held closed while the stabilisation system is in operation, the other terminal of the switch 14 being connectable, respectively via electronic switches 15 and 16, to the inputs of a linear amplifier 17 and an integrator 18 which respectively incorporate operational amplifiers 19 and 20. The capacitor 21 of the integrator 18 has connected across it a manually operable switch 22, which is held open while the stabilisation system is in operation; the switches 14 and 22 are provided so that if desired the spectrometer can be operated without stabilisation of the magnet 1, the switches 14 and 22 then being respectively held open and closed. The switches 15 and 16 are operated by means of signals derived from the timing unit 10, the arrangement being such that the switch 15 is closed at the end of each pulse generated by means of the gate 9, the switch 16 is closed a short time after the closure of the switch 15, and the switches 15 and 16 are simultaneously reopened after a further delay such that the total time for which the switch 15 is closed is approximately equal to $T_2^*$; each closure of the switch 15 defines the start of a correcting period, the end of which is defined by the reopening of the switches 15 and 16. The outputs of the amplifier 17 and integrator 18, which respectively correspond to the first and second control signals referred to above, are combined in a summing circuit 23 incorporating an operational amplifier 24, the output of the circuit 23 being applied to the shift coils of the magnet 1.

The stabilisation system, the magnet 1 and the reference sample together effectively constitute a phase locked loop operative during the correcting periods, with the function of a voltage controlled oscillator being performed by the deuteron spin system in the reference sample. In the equilibrium state of the loop, the error signal produced by the detector 13 has zero value, the two signals applied to the detector 13 then of course having the same frequency but being in phase quadrature; in this state the output of the amplifier 17 will also have zero value, but the output of the integrator 18 will have a non-zero value of magnitude such that the intensity of the field generated by the magnet 1 has the desired relationships with the frequencies of the sources 5 and 8. In explaining the operation of the loop it is convenient to consider two consecutive correcting periods and to assume that at the end of the first the loop is in the equilibrium state. During the interval between the two correcting periods, no significant change can take place in the output of the circuit 23 because the switches 15 and 16 are open, so that the output of the amplifier 17 will remain zero and the output of the integrator 18 will remain substantially constant. Any change in the magnetic field intensity occurring during this interval will result in the error signal, and hence the output of the amplifier 17, having a non-zero value at the start of the second correcting period; moreover, at this instant the two signals applied to the detector 13 will have an arbitrary phase relationship, and this will in general give rise to an initial error signal of non-zero value, regardless, of whether or not any change has occurred in the magnetic field intensity. It is essential that the latter factor should not be allowed to influence the output of the integrator 18, and it is for this reason that the switch 16 is not closed simultaneously with the switch 15. In the initial part of the second correcting period, while the switch 16 remains open, the appearance of a finite output from the amplifier 17 will cause a change in the magnetic field intensity such as to cause the system to be driven rapidly into a condition in which the Larmor frequency of the deuterons in the reference sample is effectively locked to the frequency of the source 8 and in which (because the output of the integrator 18 will not have changed significantly since the end of the first correcting period) the two signals applied to the detector 13 will be approximately in phase quadrature; the time taken for the system to reach this condition depends on the precise "pull-in" characteristics of the loop, including the characteristics of the magnet 1. The delay in closing the switch 16 after closure of the switch 15 is chosen so as to be sufficiently long to ensure that effective frequency locking has occurred before the switch 16 is closed; typically the duration of this delay will be in the range of about 10–20 milliseconds. When the switch 16 is closed in the second correcting period, the error signal will in general still have a non-zero value, because some slight drift in the magnetic field intensity is likely to have occurred since the end of the first correcting period; closure of the switch 16 of course allows the output of the integrator 18 to change in response to the presence of an error signal having a non-zero value. Thus in the latter part of the second correcting period, after closure of the switch 16, the output of the integrator 18 will tend towards the value required in the equilibrium state of the loop, with the error signal, and hence the output of the amplifier 17, simultaneously tending towards zero value; in other words during this time the output of the integrator 18 progressively takes over from the output of the amplifier 17 the function of adjustment of the magnetic field intensity. The speed with which this process occurs will naturally depend on the time constant of the integrator 18, choice of which may be influenced by considerations relating to the signal/noise ratio of the received signals. It will usually be possible to choose a value for this time constant such that in normal operation of the stabilisation system the loop will be substantially restored to the equilibrium state before the end of each correcting period, although when the stabilisation system is first switched on the initial establishment of the equilibrium state may not be achieved until several correcting periods have occurred. Typically the time constant of the integrator 18 could have a value in the range of about 10–100 milliseconds.

It will be appreciated from the foregoing that the locking action of the loop is substantially independent of the value of the error signal at the start of a correcting period, which is dependent on the value at that time of the phase difference between the two signals applied to the detector 13. The operation of the stabilisation system is thus substantially unaffected by drifts in phase such as may occur due to changes in the temperature of the probe 2.

We claim:

1. A stabilisation system for a magnet employed in a pulsed nuclear magnetic resonance spectrometer, said system comprising:

means for exciting magnetic resonance of a given nuclear species in a reference sample subjected to the magnetic field generated by said magnet, by irradiating said sample with pulses of radio frequency energy spaced apart by intervals substantially greater than the time constant for free induction decay of said magnetic resonance;

means for receiving resonance signals emanating from said sample during said intervals as a result of the excitation of said magnetic resonance;

a detection system for effecting phase-sensitive detection of said resonance signals with reference to said radio frequency energy;

means for deriving a first control signal which is proportional to the output of said detection system;

means for causing said deriving means to be operative only during periods which immediately follow said pulses and have a duration approximately equal to said time constant;

an integrator;

means for applying the output of said detection system to said integrator only during a portion of each of said periods, the start of said portion being later than the start of the relevant period;

means for deriving a second control signal which is proportional to the output of said integrator; and means for adjusting the intensity of said magnetic field by the application to said magnet of said first and second control signals, the delay between the start of each of said periods and the start of said portion of that period being sufficiently long to ensure that during said delay the adjustment of said magnetic field by virtue of the application of said first control signal will bring about effective locking of the frequency of said resonance signals to the frequency of said radio frequency energy.

* * * * *